US005817975A

United States Patent [19]
Heilmann

[11] Patent Number: 5,817,975

[45] Date of Patent: Oct. 6, 1998

[54] HOUSING WITH INTEGRAL MOUNTING BRACKET

[75] Inventor: Ron Heilmann, Florence, Miss.

[73] Assignee: Magnetek, Inc., Nashville, Tenn.

[21] Appl. No.: 531,585

[22] Filed: Sep. 21, 1995

[51] Int. Cl.$^{6}$ ........ H05K 5/00

[52] U.S. Cl. ........ 174/50

[58] Field of Search ........ 174/50, 58, 48; 220/3.4, 36, 3.9; 336/90

[56] References Cited

U.S. PATENT DOCUMENTS

| | | | |
|---|---|---|---|
| 2,740,905 | 4/1956 | Henderson | 307/156 |
| 4,199,072 | 4/1980 | Jacks | 220/3.4 |
| 5,177,325 | 1/1993 | Giammanco | 174/50 |
| 5,192,227 | 3/1993 | Bales | 439/532 |

*Primary Examiner*—Kristine L. Kincaid
*Assistant Examiner*—Joseph Waks
*Attorney, Agent, or Firm*—Darby & Darby

[57] ABSTRACT

A housing having a main section for holding an object, such as a ballast transformer, that has side walls and an open top. A lid having a shape conforming to that of the housing main section has side walls that fit over the main section side walls and covers the open top. The lid has an integral bracket of general U-shape that extends from one of the edges of the lid with the open part of the U facing upwardly toward the lid top. The bracket permits the housing and its contents to be suspended from an external mount.

7 Claims, 1 Drawing Sheet

HOUSING WITH INTEGRAL MOUNTING BRACKET

FIELD OF THE INVENTION

The invention relates to a housing that has a central section for holding an object and a lid for the central section with the lid having an integral bracket used to mount the housing.

BACKGROUND OF THE INVENTION

Many different types of objects are enclosed in a housing, one such type of housing being for a ballast transformer. This housing has a central section, commonly called a can, in which the transformer components and wires are placed. The can has an open top which is closed by a lid. In order to mount the ballast transformer at its point of use, such as in a lighting fixture, the can or cover of a conventional housing is usually provided with tabs having slots through which screws are placed.

In some cases, it is desirable or necessary to mount the ballast transformer housing in a different manner. This includes, for example, hanging the transformer from a wire or a rail. In the prior art, this was accomplished by providing the housing with one or more brackets. The brackets are of generally U-shape and connected to one of the can's side walls by a suitable fastener, such as a rivet, or by welding. The attachment of such a bracket to a housing for a ballast transformer, although it appears to be relatively simple, presents problems in large scale production. Because the can external surface is pre-painted, welding cannot be accomplished without first cleaning off a space to which the bracket would be fastened. This adds a step to the manufacturing process. While rivets are suitable fasteners, they are relatively costly in the sense that they require extra components, the rivets and brackets, and the extra manufacturing step of riveting the brackets to the can. In the use of either welding or rivets, a separate bracket piece must be manufactured, stored and handled.

BRIEF DESCRIPTION OF THE INVENTION

The present invention relates to a housing that has an integral mounting bracket. In the preferred embodiment of a housing for a ballast transformer, there is can for holding the transformer components and a lid sealed to the can. A bracket is integrally formed on the lid. The lid and its integral bracket are made in one step by forming a metal blank, such as by die stamping. Therefore, an integral hanger of any desired shape and size can be made that is consistent with the forming process and the size of the lid being made.

The invention is cost effective in that it saves on the separate forming, handling and attaching of the separate bracket parts such as used in the prior art.

OBJECTS OF THE INVENTION

It is therefore an object of the present invention to provide a housing with an integral bracket for mounting the housing and the object contained therein.

An additional object is to provide a housing for a ballast transformer having an open top main section, or can, holding the ballast transformer and other components, and a lid of a shape conforming to the central section for covering the open top, with the lid having an integrally formed mounting bracket.

Yet another object is to provide a transformer housing including a can and a lid with the lid having an integrally formed bracket to mount the housing.

BRIEF DESCRIPTION OF THE DRAWINGS

Other objects and advantages of the present invention will become more apparent upon reference to the following specification and annexed drawings in which.

DETAILED DESCRIPTION OF THE INVENTION

Figure 1:
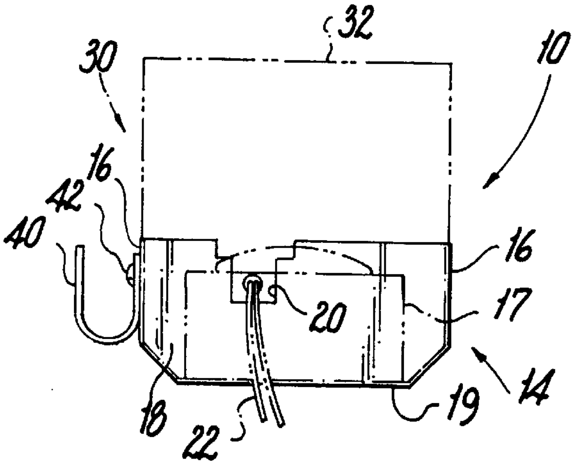
Fig. 1 (PRIOR ART)
FIG. 1 is an exploded perspective view of a ballast transformer made according to the prior art.

FIG. 1 shows a prior art design of a ballast transformer generally designated 10. Its housing includes a generally rectangular can 14 of metal, which is usually stamped, having sidewalls 16, end walls 18, and a bottom wall 19. The can is chamfered between the side walls and the bottom wall, as shown most clearly in FIG. 2, although this is not necessary. The can 14 can be of any desired length and width. The side and end walls 16 and 18 define an open top.

Located within the can 14 are a number of components, illustratively shown as core 17 of the transformer and its windings. The can 14 can also contain other components, such as, for example, one or more terminal boards, one or more capacitors and resistors for the ballast circuit, etc. These are not shown. One of the end walls 18 has a cutout 20 through which wires 22 to be connected to the ballast transformer within the can 14 are passed. The transformer and associated components are relatively heavy and a typical ballast can weight from 4 to 10 pounds.

A lid 30 is provided that has a top 32 and downwardly extending side walls, or lips, 34. Lid 30 is also of metal and is made by stamping. The size and shape of the lid corresponds to the size and shape of the can's open top so that it can completely seal the can. Usually, after all the components are mounted within the can, it is filled with a suitable asphaltic compound and when the top 30 is placed over the can, the overflow of the asphalt and a pressure fit of the lid 30 seals the lid to the can. The outer surfaces of the can and lid are usually painted to minimize corrosion. All of this is conventional.

The housing of FIG. 1 has a separate bracket 40 attached to one of its side walls 16. Attachment is accomplished by one or more rivets 42 inserted through one or more holes in the bracket. The bracket 40 is shown as being generally U-shaped although other shapes, such as L, are possible. The bracket 40 is elongated and extends along a selected portion of the length of the can side wall 16, for example, about the middle third of the length of the can side wall. A bracket of such length would typically require two or three rivets to securely fasten it to the can. Several brackets 40 may be used along the length of the can. If several brackets are used, each requires its own set of rivets for fastening.

Figure 2:
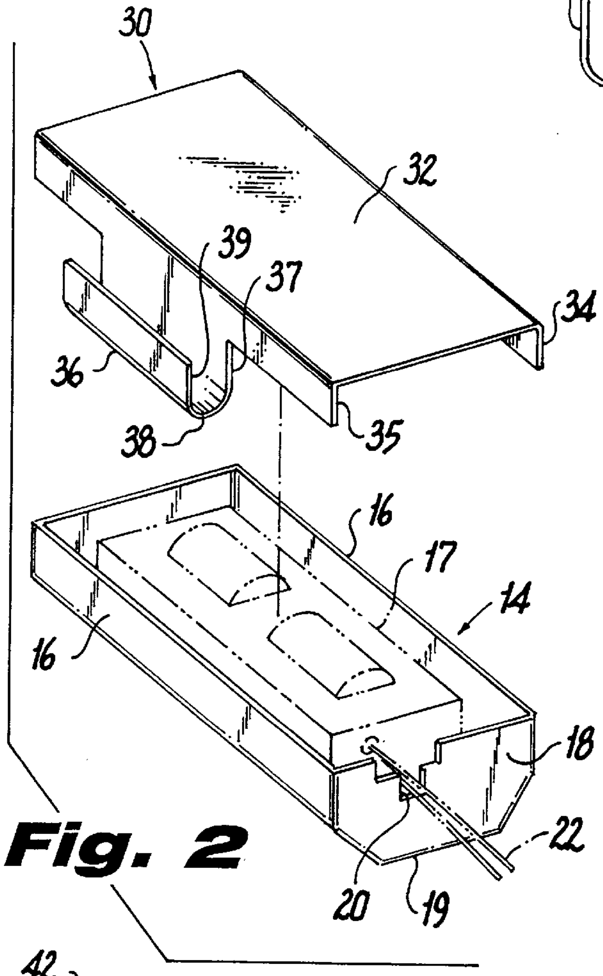
FIG. 2 is an exploded perspective view of a ballast made in accordance with the subject invention.
Figure 3:
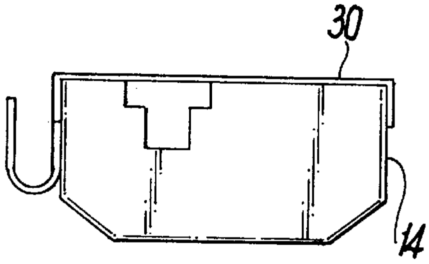
FIG. 3 is an elevational view showing the lid assembled to the can.

FIGS. 2 and 3 show a preferred embodiment of the subject invention. The same reference numerals have been used for the same components shown in FIG. 1. The can 14 and its internal components are of the same construction as previously described.

In FIG. 2 it can be seen that the lid 30 has one of its lips 35 integrally formed with a generally U-shaped bracket 36. That is, the lid is stamped from a blank of metal with the bracket 36 being formed during the stamping. No welding or other fasteners are used for the bracket.

The bracket 36 has a leg 37 that projects and continues downwardly from the lid lip 35, a curved center portion 38 and an upwardly extending leg 39. If desired, the curved center portion 38 can be made flat. The length of the legs 37 and 39 can be made shorter or longer, as desired. Also, after the bracket is formed, leg 39 can be deformed inwardly to decrease the width of the opening into the bracket.

The length of the bracket 36 is shown as being about one-third the length of the lid and the bracket is shown as being centered on the lid. Alternatively, the bracket can be formed in sections, for example, one bracket 36 near each end of the lid and another bracket in the center. Any combination of bracket section length and spacing can be used as desired.

FIG. 3 shows the lid 30 attached to the can 14. The lid 30 is seated on the can 14 and fastened to it in the same manner as in the prior art design of FIG. 1. No change in tooling is needed for seating and fastening the lid to the can since no part of the bracket 36 extends above the lid top 32. In addition, the bottom center part 38 of bracket 36 extends only part way down the height of the can side walls, here shown above the chamfered corners of the can 16.

Figure 4:
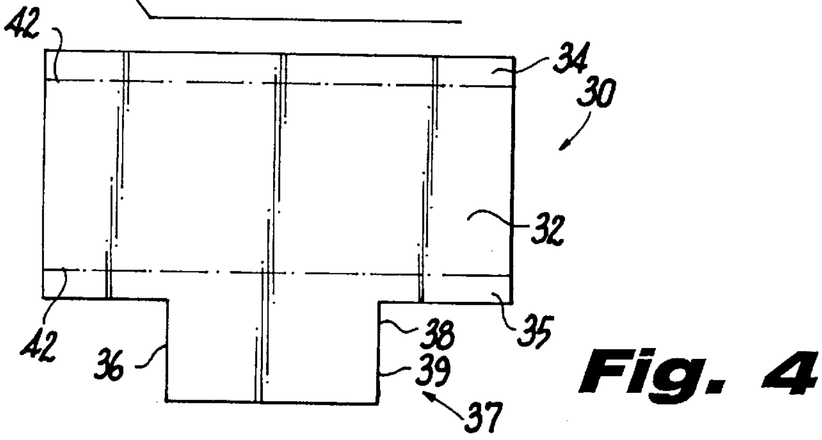
FIG. 4 is a top view of the blank used in forming the lid.

FIG. 4 shows a layout of the blank that is used for stamping of the lid 30. The blank is shown with fold lines 42 along the lid length. The bracket 36 is an extension of the lid top. In forming the lid 30, the blank is inserted into a suitable die such that when stamping pressure is applied, the lips 34, 35 are bent downwardly along lines 42. A male part of the die engages the bracket part 36 of the blank to form the U-shape bracket. The stamping can be either in a single step or in several sequential steps, as is conventional.

Since bracket 36 is an integral part of the lid 30, no separate bracket and attendant fastening elements, such as screws or rivets, and no separate fastening step are needed. Therefore, the cost for making the housing with the bracket 36 is only increased by the extra metal added to the blank that is needed to make the bracket. This is basically not an extra cost since a separate bracket also requires metal. In addition, it requires a separate forming die and forming step.

As can be seen, a novel housing has been provided, which has a central section, or can, with an open top covered by a lid. The lid has an integral bracket to permit the housing to be mounted to an external surface, such as a wire or rail. The lid with integral bracket requires no separate fastener components, no manufacture, storage and handling of the separate fastener components, and fastening of the separate fastener components to any part of the housing.

What is claimed is:

1. In combination:

a housing having a main section for holding an object, said main section having opposing side walls defining an open top, a lid for attachment to said main section to cover said open top, maid lid having a lip positioned to extend over and along the outside of at least one of said side walls, when said lid is attached to said main section and a log integrally formed as a substantially continuous extension of said lip along one of said housing side walls to form a hanger bracket to attach the housing to an external mount, said bracket having a first log having one end extending in a first direction downwardly from said lip along and opposing one of said side walls over which said lip extends, a central section having one end attached to the other end of said first leg and opposite to said one of said side walls, and a second leg having one end attached to the another end of said central section and extending in a direction opposite to said first leg first direction back toward said lid leaving a space between said first and second legs that lies opposite said one of said side walls.

2. The combination as in claim 1 wherein said bracket is of generally U-shape with an open part of the U formed by said central section facing toward said lid.

3. The combination as in claim 1 wherein said housing main section and said lid are of generally rectangular shape and said bracket is located along one of the side walls of said housing.

4. The combination as in claim 1 wherein said bracket extends along substantially an entire dimension of said lid.

5. The combination as in claim 4 wherein said bracket is of generally U-shape with the open part of the U facing toward said lid.

6. The combination as in claim 1 wherein said bracket is in sections along the length of said lid.

7. The combination as in claim 6 wherein said bracket is of generally U-shape with the open part of the U facing toward said lid.

* * * * *